(12) United States Patent
Liu

(10) Patent No.: US 8,582,342 B2
(45) Date of Patent: *Nov. 12, 2013

(54) NON-VOLATILE ONE-TIME-PROGRAMMABLE AND MULTIPLE-TIME PROGRAMMABLE MEMORY CONFIGURATION CIRCUIT

(75) Inventor: David K. Y. Liu, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/362,687

(22) Filed: Jan. 31, 2012

(65) Prior Publication Data

US 2012/0140564 A1   Jun. 7, 2012

Related U.S. Application Data

(63) Continuation of application No. 12/650,238, filed on Dec. 30, 2009, now Pat. No. 8,203,861.

(60) Provisional application No. 61/141,618, filed on Dec. 30, 2008.

(51) Int. Cl.
*G11C 17/00* (2006.01)

(52) U.S. Cl.
USPC ........................................ 365/94; 365/185.24

(58) Field of Classification Search
USPC .............................................. 365/94, 185.24
See application file for complete search history.

(56) References Cited

U.S. PATENT DOCUMENTS

| | | | |
|---|---|---|---|
| 4,087,795 A | 5/1978 | Rossler | |
| 4,328,565 A | 5/1982 | Harari | |
| 4,412,311 A | 10/1983 | Miccoli et al. | |
| 4,532,611 A | 7/1985 | Countryman, Jr. | |
| 4,870,304 A | 9/1989 | Bloker et al. | |
| 5,021,999 A | 6/1991 | Kohda et al. | |
| 5,283,759 A | 2/1994 | Smith | |
| 5,410,268 A | 4/1995 | Sharpe-Geisler | |
| 5,548,146 A | 8/1996 | Kuroda et al. | |
| 5,586,073 A | 12/1996 | Hiura et al. | |
| 5,712,816 A | 1/1998 | Cappelletti et al. | |

(Continued)

FOREIGN PATENT DOCUMENTS

| | | |
|---|---|---|
| JP | 5021809 B2 | 1/1993 |
| JP | 08-340057 A | 12/1996 |

(Continued)

OTHER PUBLICATIONS

Clendenin, M. "eMemory extends OTP to 0.15 μm high voltage process," EE Times Asia, Jul. 26, 2006, 1 page.

(Continued)

*Primary Examiner* — Michael Tran

(74) *Attorney, Agent, or Firm* — Lerner, David, Littenberg, Krumholz & Mentlik, LLP

(57) ABSTRACT

A programmable non-volatile configuration circuit uses a pair of non-volatile memory devices arranged in a pull-up and pull-down arrangement. The non-volatile memory devices have floating gates that overlaps a variable portion of a source/drain region. This allows a programming voltage for the device to be imparted to the floating gate through variable capacitive coupling, thus changing the state of the device. The invention can be used in environments to store configuration data for programmable logic devices, field programmable arrays, and many other applications.

15 Claims, 7 Drawing Sheets

(56) References Cited

U.S. PATENT DOCUMENTS

| | | | |
|---|---|---|---|
| 6,055,191 A | 4/2000 | Sher et al. | |
| 6,303,516 B1 | 10/2001 | Morita et al. | |
| 6,400,603 B1 | 6/2002 | Blyth et al. | |
| 6,441,443 B1 | 8/2002 | Hsu et al. | |
| 6,489,202 B1 | 12/2002 | Hsu et al. | |
| 6,501,685 B2 | 12/2002 | Hsu et al. | |
| 6,631,087 B2 | 10/2003 | Di Pede et al. | |
| 6,678,190 B2 | 1/2004 | Yang et al. | |
| 6,914,825 B2 | 7/2005 | Hsu et al. | |
| 6,920,067 B2 | 7/2005 | Hsu et al. | |
| 7,032,064 B2 | 4/2006 | Barnett et al. | |
| 7,471,570 B2 | 12/2008 | Morton et al. | |
| 7,528,036 B2 | 5/2009 | Adachi et al. | |
| 7,729,864 B2 * | 6/2010 | Schadt | 702/19 |
| 7,782,668 B2 | 8/2010 | Liu | |
| 7,787,295 B2 | 8/2010 | Liu et al. | |
| 7,787,304 B2 | 8/2010 | Liu | |
| 7,808,818 B2 | 10/2010 | Eitan | |
| 7,852,656 B2 * | 12/2010 | Shin et al. | 365/94 |
| 7,852,672 B2 | 12/2010 | Liu et al. | |
| 7,876,615 B2 | 1/2011 | Liu et al. | |
| 8,208,299 B2 | 6/2012 | Liu et al. | |
| 8,305,805 B2 | 11/2012 | Liu | |
| 8,325,519 B2 | 12/2012 | Liu et al. | |
| 2002/0118575 A1 | 8/2002 | Sonoda et al. | |
| 2003/0145154 A1 | 7/2003 | Barnett et al. | |
| 2003/0198087 A1 | 10/2003 | Kinsey et al. | |
| 2004/0197993 A1 | 10/2004 | Georgescu | |
| 2005/0023656 A1 | 2/2005 | Leedy | |
| 2005/0056880 A1 | 3/2005 | Kim et al. | |
| 2005/0184332 A1 | 8/2005 | Hirooka et al. | |
| 2006/0057798 A1 | 3/2006 | Komori et al. | |
| 2006/0067124 A1 | 3/2006 | Lee et al. | |
| 2006/0098488 A1 | 5/2006 | Tanaka et al. | |
| 2006/0163636 A1 | 7/2006 | Cheng et al. | |
| 2007/0047302 A1 | 3/2007 | Lee et al. | |
| 2007/0064494 A1 | 3/2007 | Morton et al. | |
| 2007/0127290 A1 | 6/2007 | Kato | |
| 2007/0159880 A1 | 7/2007 | Eitan | |
| 2007/0194371 A1 | 8/2007 | Benjamin | |
| 2007/0247902 A1 | 10/2007 | Chen et al. | |
| 2007/0247917 A1 | 10/2007 | Martinelli et al. | |
| 2007/0255893 A1 | 11/2007 | Takeuchi | |
| 2007/0279985 A1 | 12/2007 | Hemink | |
| 2008/0035973 A1 | 2/2008 | Lin et al. | |
| 2008/0074180 A1 | 3/2008 | Watanabe et al. | |
| 2008/0186772 A1 | 8/2008 | Horch | |
| 2008/0225593 A1 | 9/2008 | Mitros et al. | |
| 2009/0016118 A1 | 1/2009 | Widjaja et al. | |
| 2010/0165698 A1 | 7/2010 | Liu | |
| 2012/0140564 A1 | 6/2012 | Liu | |

FOREIGN PATENT DOCUMENTS

| | | |
|---|---|---|
| JP | 2001-358313 A | 12/2001 |
| JP | 2005038894 A | 2/2005 |
| JP | 2005057106 A | 3/2005 |
| JP | 2006507693 A | 3/2006 |
| JP | 2007-067428 A | 3/2007 |

OTHER PUBLICATIONS

Clendenin, Mike; "Flash maker eMemory gaining foundry converts," EE Times Asia, Nov. 6, 2003, 2 pages.

Datasheet, "Numonyx Embedded Flash Memory(J3vD)," Dec. 2007, 66 pages.

International Search Report and Written Opinion for PCT/US2008/82294, mailed Dec. 19, 2008, 8 pages.

International Search Report and Written Opinion for PCT/US2008/83697, mailed Jan. 9, 2009, 21 pages.

Non Final Office Action for U.S. Appl. No. 12/264,029 mailed May 27, 2010, 11 pages.

Non Final Office Action for U.S. Appl. No. 12/264,060 mailed May 28, 2010, 12 pages.

Non Final Office Action for U.S. Appl. No. 12/264,076 mailed Jun. 1, 2010, 10 pages.

Non Final Office Action for U.S. Appl. No. 12/271,695 mailed Jun. 11, 2010, 11 pages.

UMC, "Embedded Memory SoC Process Technology," undated, 8 pages.

English Translation of Japanese Office Action for Application No. 2010-532325 dated Jul. 12, 2013.

Japanese Office Action for Application No. 2010-534250 dated Aug. 13, 2013.

* cited by examiner

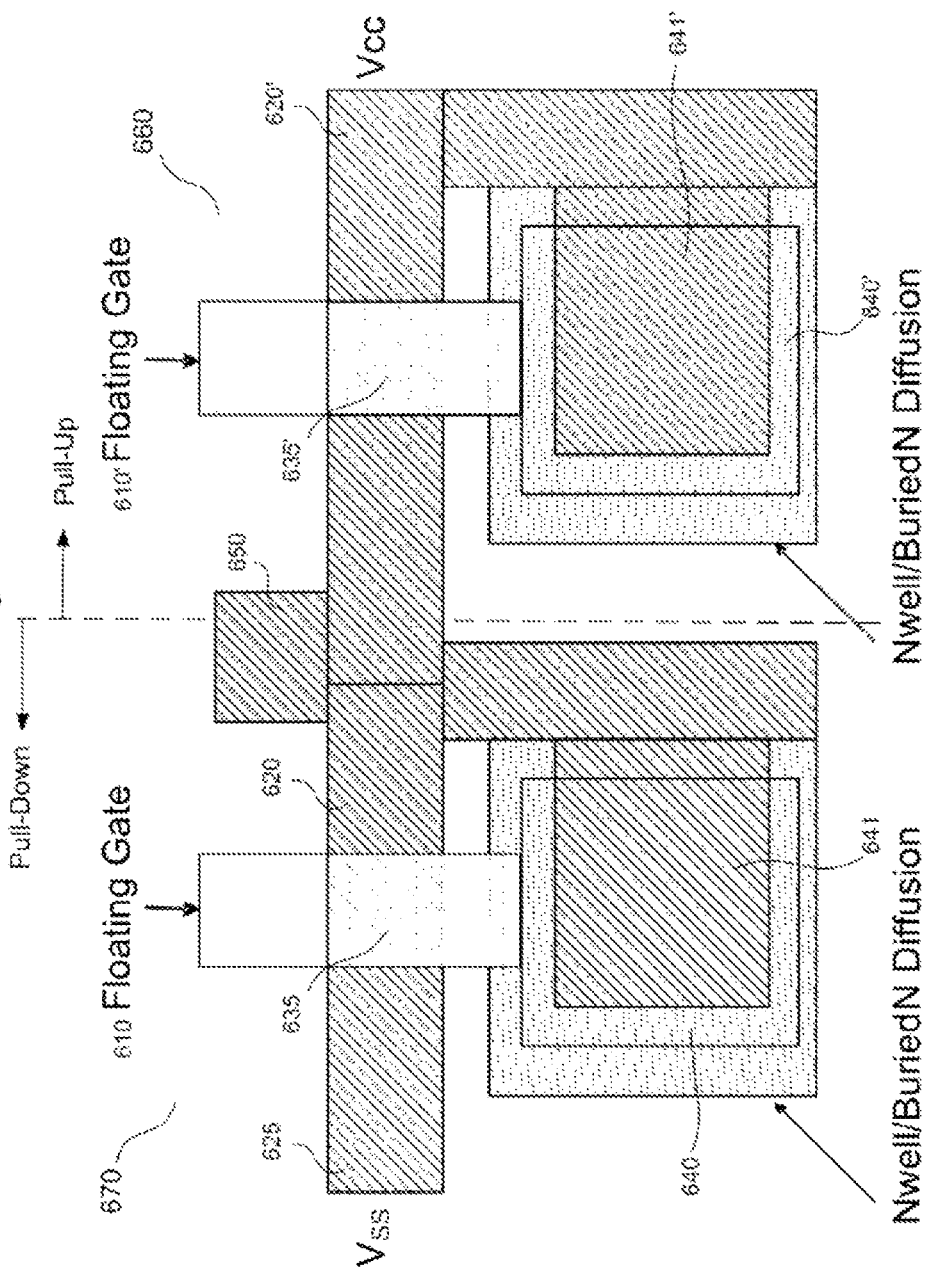

US 8,582,342 B2

NON-VOLATILE ONE-TIME-PROGRAMMABLE AND MULTIPLE-TIME PROGRAMMABLE MEMORY CONFIGURATION CIRCUIT

RELATED APPLICATION DATA

The present application is a continuation of U.S. Pat. No. 12/650,238, filed on Dec. 30, 2009 and which issued as U.S. Pat. No. 8,203,861 on Jun. 19, 2012, which claims the benefit of the filing date of U.S. Provisional Application No. 61/141,618, filed on Dec. 30, 2008, the disclosures of which is hereby incorporated herein by reference. The application is further related to U.S. Pat. Nos. 7,782,668, 7,787,304 and 7,878,309, all filed on Nov. 3, 2008 which are hereby incorporated herein by reference.

FIELD OF THE INVENTION

The present invention relates to non-volatile configuration circuits which can be programmed one time, or multiple times in some instances. The invention has particular applicability to applications where is it desirable to customize electronic circuits, including programmable logic devices, field programmable gate arrays, etc.

BACKGROUND

Field Programmable Gate Arrays (FPGAs) are well-known circuits used in a variety of electronic devices/computing systems. FPGAs offer the ability to update their functionality in the field, which is a substantial advantage over fixed ASIC type devices. FPGAs contain reconfigurable interconnects that allow predefined logic blocks to be wired together.

Typically an SRAM is used to configure the functions of the logic blocks and the routing of the interconnections. Recent implementations, however, use a form of non-volatile memory to perform this function. These devices, however, are not optimal, however, as they require additional processing step to embed them within a logic circuit.

One time programmable (OTP) and multi-time programmable (MTP) memories have been recently introduced for beneficial use in a number of applications where customization is required for both digital and analog designs. These applications include data encryption, reference trimming, manufacturing ID, security ID, and many other applications. Incorporating OTP and MTP memories nonetheless also typically comes at the expense of some additional processing steps.

A new form of OTP is disclosed in the aforementioned U.S. application Ser. No. 12/264,029 and which is incorporated by reference herein. In that disclosure, a new type of single-poly non-volatile memory device structure can be operated either as an OTP (one time programmable) or as an MTP (multiple time programmable) memory cell is disclosed. The device structure is fully compatible with advanced CMOS logic process, and would require, at the worst case, very minimal additional steps to implement. A unique aspect of the device is that the floating gate of the memory cell structure is electrically coupled strongly through one of the S/D junctions of the transistor, whereas traditional single poly nonvolatile memory cells require either an additional interconnect layer to couple to the floating gate, or the floating gate has virtually none or minimal electrical coupling to any of the existing electrical signals.

Another key feature is that it is implemented with an NMOS device structure, whereas the traditional single-poly OTP is commonly implemented with a PMOS device structure. This means that the device can be formed at the same time as other n-channel devices on a wafer.

Another advantage of an NMOS device structure is that it behaves similar to an EPROM device, i.e., the device is programmed into a non-conducting state from a conducting state. (The most commonly used PMOS OTP device is programmed from a non-conducting state into a conducting state). This can eliminate the need of an additional masking step that is commonly associated with a PMOS OTP device in order to make sure that PMOS device is in a non-conducting state coming out of the manufacturing fab. In addition, since an NMOS device's programming mechanism with channel hot electrons injection is self-limiting, unlike that case of a PMOS with channel hot electron programming, the amount of energy consumption during programming is self-limited for this invention.

Another NMOS OTP implementation is disclosed by U.S. Pat. No. 6,920,067, incorporated by reference herein. The device in this reference is programmed with channel hot-hole-injection. The disclosure teaches that the device is programmed into conducting state, after the channel hot hole injection. However, it is unclear whether the device actually works in the way the inventors claim.

That is, it is not apparent that the channel current will be initiated to induce hot-hole-injection since the state of the floating gate is unknown and there is no available means to couple a voltage unto the floating gate. An NMOS device will conduct a channel current to initiate the hot hole injection only when the floating gate potential is sufficient to turn on the device, or when the threshold voltage is always low initially to allow channel current conduction. The only way to ensure either scenario is to introduce an additional process step to modify the turn on characteristics of the NMOS. Now assuming the channel is conducting initially and hot holes are injected, the holes injected on the floating gate will make the device more conductive. So the device basically goes from a conductive state (in order to initiate channel current for hot hole injection) to a highly conductive state.

This is not a very optimal behavior for a memory device.

Another prior art device described in U.S. publication no. 2008/0186772 (incorporated by reference herein) shows a slightly different approach to the problem of providing a programming voltage to a floating gate embodiment of an OTP device. In this design, shown in FIG. 4, the drain border length L1 is increased relative to the source side length L1 to increase a coupling ratio to the erasable floating gate 416. By increasing the coupling ratio, the amount of channel current is increased; therefore the charge injection into the floating gate will also increase. The drawbacks of this cell, however, include the fact that the cell and channel 412 must be asymmetric, and the coupling is only controlled using the length dimension of the active regions. Because of these limitations, it also does not appear to be extendable to a multi-level architecture. Moreover, it apparently is only implemented as a p-channel device.

Accordingly there is clearly a long-felt need for an embedded programmable configuration circuit which is capable of addressing these deficiencies in the prior art.

SUMMARY OF THE INVENTION

An object of the present invention, therefore, is to overcome the aforementioned limitations of the prior art.

It will be understood from the Detailed Description that the inventions can be implemented in a multitude of different embodiments. Furthermore, it will be readily appreciated by skilled artisans that such different embodiments will likely include only one or more of the aforementioned objects of the present inventions.

Thus, the absence of one or more of such characteristics in any particular embodiment should not be construed as limiting the scope of the present inventions. While described in the context of a non-volatile memory array, it will be apparent to those skilled in the art that the present teachings could be used in any number of applications.

DESCRIPTION OF THE DRAWINGS

FIG. 6A is a top down view of the preferred non-volatile configuration circuit of the present invention;

DETAILED DESCRIPTION

The present disclosure concerns a new type of non-volatile configuration circuit (preferably single poly) that can be operated either as an OTP (one time programmable) or as an MTP (multiple time programmable memory cell). The preferred device structure is fully compatible with advanced CMOS logic process, and would require, at the worst case, very minimal additional steps to implement.

A unique aspect of the present device is that the floating gate of the memory cell structure is electrically coupled strongly through a variable number of S/D junctions of the transistor, whereas traditional single poly nonvolatile memory cells require either an additional interconnect layer to couple to the floating gate, or the floating gate has virtually none or minimal electrical coupling to any of the existing electrical signals. Moreover, unlike the 2008/0186772 reference, the coupling ratio can be more specific and precise. That is, by exactly controlling the coupling ratio (through areal means) the amount of charge, and thus the final programmed Vt, are directly proportional to the product of the coupling ratio and the drain voltage. It can be more precisely controlled such that the coupling ratio is dictated or designed by the desired programming threshold level (Vt) of the memory cell. This allows for a design that evolves easily into a multi-level version of an OTP since different coupling ratios yield different programmed Vt.

Figure 1:
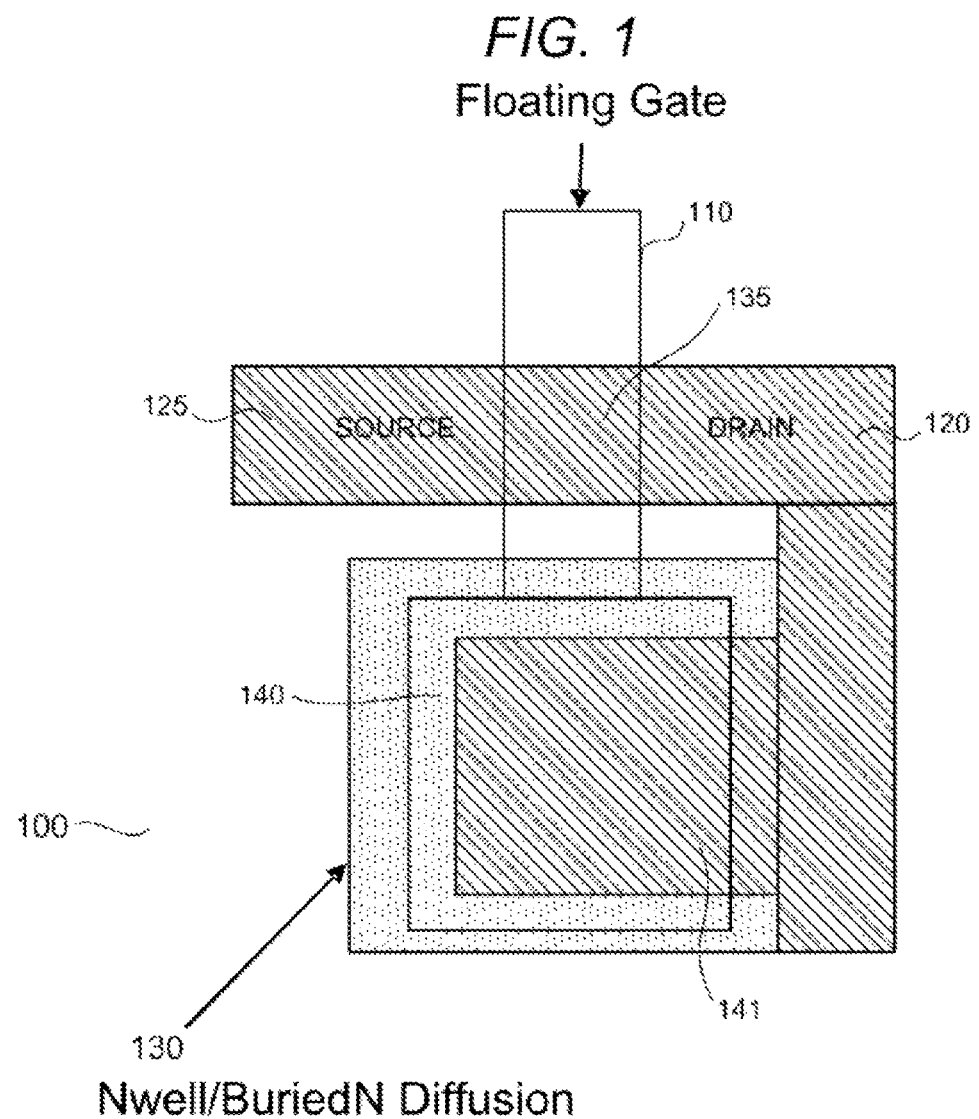
FIG. 1 is a top down view of a preferred embodiment of a non-volatile memory cell of the present invention.
Figure 2:
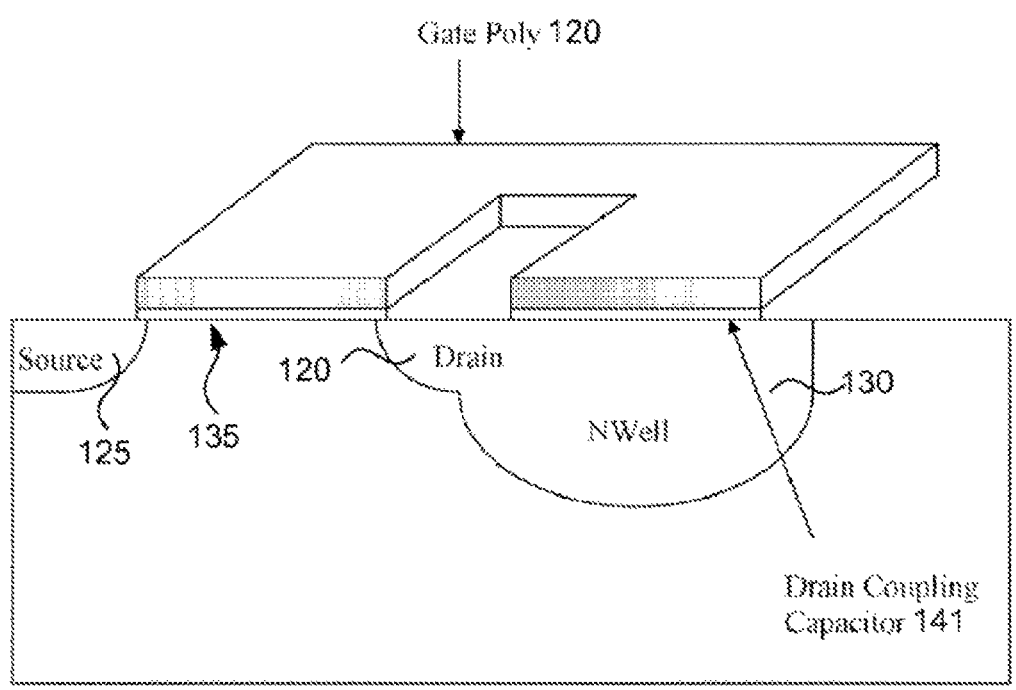
FIG. 2 is a side cross section view of the preferred non-volatile memory cell.

FIG. 1 illustrates the top view of the layout of a preferred structure used in the present invention. FIG. 2 illustrates a representative cross-sectional view of the device structure. It will be understood that these drawings are not intended to be set out to scale, and some aspects of the device have been omitted for clarity.

The device includes a typical NMOS transistor 100 which is modified so that the gate (poly in a preferred embodiment) 110 of the device is not electrically connected to a voltage source. A drain 120 of the device is bent around and is preferably joined by an N-type well 130 that typically already exists in a conventional advanced CMOS process. As an alternative, the N-Well 130 can be replaced with an n-type diffusion layer introduced so as to be beneath the poly floating gate. A conventional source region 125 is also utilized.

The floating gate poly 110 is extended beyond a typical transistor channel region 135 and includes an overlap region 140 which overlaps an active region extending from the drain junction. The active region portion 141 that is surrounded by the N-Well region serves as an effective capacitive coupling to the floating gate. Thus any voltage applied to the drain junction will be effectively coupled onto the floating gate.

Figure 3:
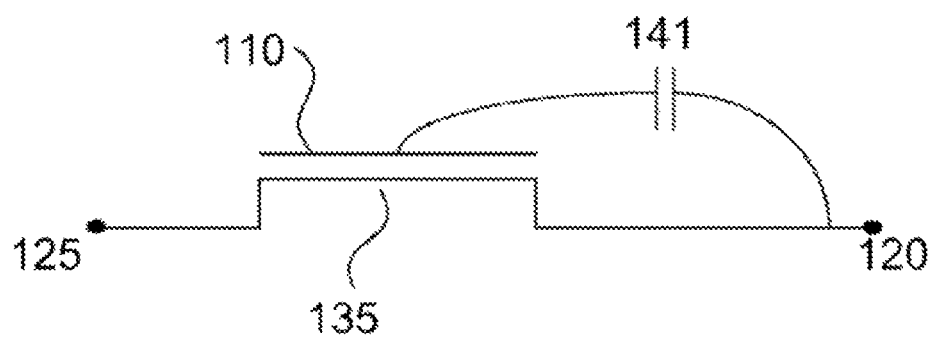
FIG. 3 is an electrical diagram illustrating the electrical relationship of the structures of the preferred non-volatile memory cell.
Figure 4:
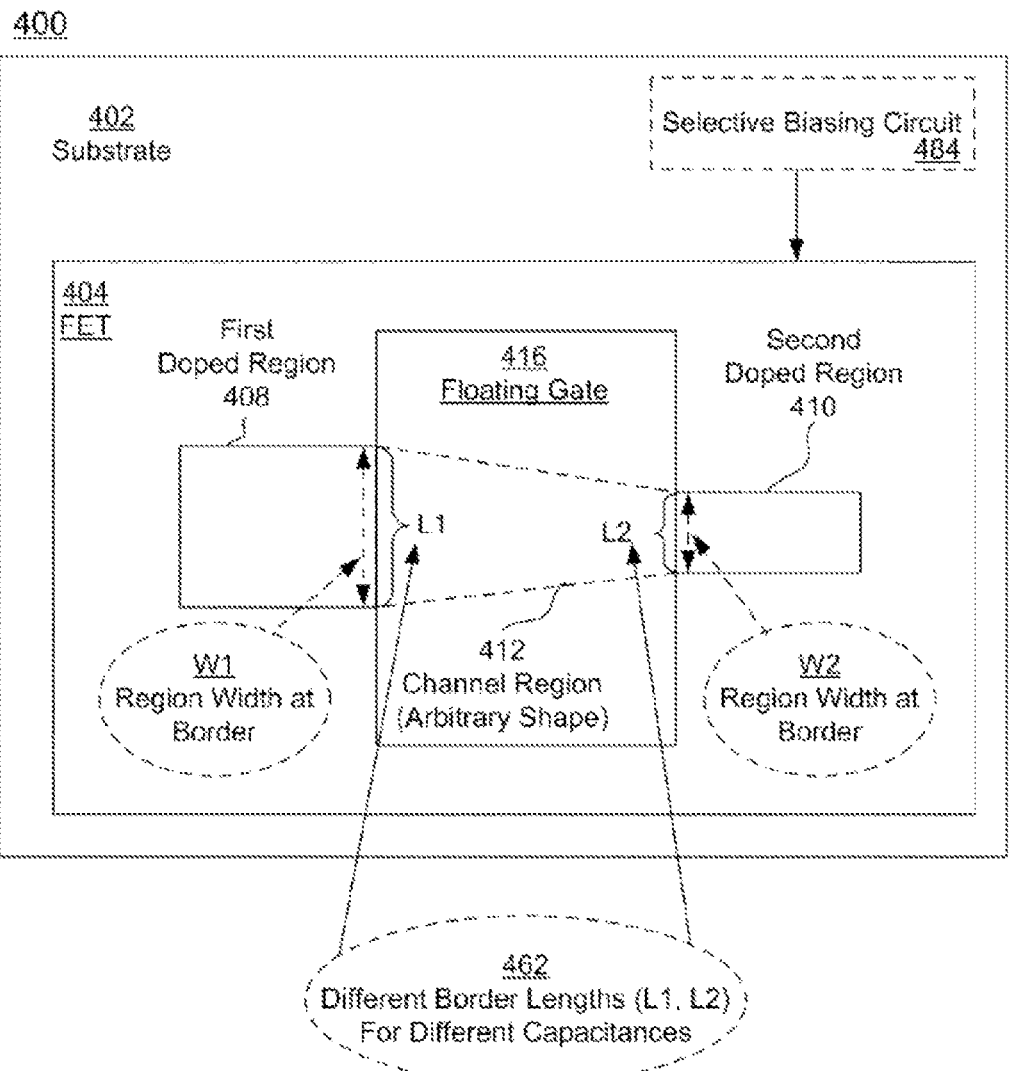
FIG. 4 depicts a prior art non-volatile memory cell which uses a floating gate for an OTP application.

As seen in the electrical diagram of FIG. 3, if the coupling ratio of the drain to the floating gate is sufficiently high—which is determined by the ratio of the area of the gate channel region and the area of the Poly extension overlapping the drain extension region—the floating gate can effectively acquire and have a high percentage of the value of the drain voltage.

A key advantage of the preferred embodiment, as seen in FIGS. 1 and 2, is that it is formed from same layers conventionally used to make active n-channel devices in a CMOS process. The only difference is that the poly (or metal as the case may be) gate layer is not interconnected with such other formed active devices or coupled to a gate signal. The other implants for the source/drain are also part of a CMOS conventional process. Thus, in most applications the invention can be integrated without any additional processing costs, because the only alteration is to an existing mask for each relevant layer of the wafer being processed.

One other optional variation of this device structure is to make the drain-to-gate coupling capacitor area on the sidewall of a trench. This will greatly reduce the area of the drain-to-gate coupling capacitor. This reduction in cell area may come at the expense of significantly increase the manufacturing process complexity. However, again, in applications where the invention is integrated with certain types of DRAM architectures (especially embedded types), it is possible to incorporate the conventional processing steps for such memories to avoid additional processing costs. Other techniques for coupling a voltage to the floating gate and achieving a desired coupling ratio will be apparent to those skilled in the art.

While the floating gate is shown as a single polysilicon layer, it will be appreciated by skilled artisans that other materials could be used as well. In some applications for example it may be possible to exploit the formation of other structures/devices which while part of other main underlying logic/memory structures, can be exploited for purposes of making a floating gate of some kind In this respect it should be noted that floating gates can typically be formed of a number of different materials, including through techniques in which impurities are implanted/diffused into a dielectric/insulating layer.

Moreover while the preferred embodiment depicts the NVM cell as part of a conventional lateral-planar FET structure on a substrate, it will be apparent to those skilled in the art that other geometries/architectures can be used, including non-planar structures. Thus the invention could be used in SOI substrates, in thin film structures, at other levels of the device than the substrate, in multi-gate (FINFET type) orientations, and in vertical/non-planar configurations. In such latter instances the floating gate would be embedded and oriented vertically with respect to the substrate.

The preferred operation of device 100 will be described. The non-volatile device structure preferably has the physical features of a conventional I/O transistor implemented in an advanced CMOS logic process. At present, such I/O transistor is nominally operated at 3.3V but it will be understood that this value will change with successive generations of manufacturing.

This type of I/O transistor typically has a threshold voltage of 0.5V to 0.7V, with a typical electrical gate oxide thickness of 70 A. With a drain coupling to floating gate ratio of 0.90, and a read drain voltage of 1.0V applied to the device, the floating gate will effectively be coupled with a voltage of about 0.90V. This is sufficient to turn on the un-programmed NMOS device 100, and a channel current can be detected by typical means of sense circuitry to identify the state of the device. It will be understood to those skilled in the art that the particular coupling ratio, read voltage, etc., will vary from application to application and can be configured based on desired device operating characteristics.

The device is originally in an unprogrammed state, which in the preferred embodiment is characterized by a low resistance coupling between the source and drain through channel region 135. This means that the channel region 135 can be substantially uniform and current flow is reliable. While the preferred embodiment is shown in the form of a symmetric cell/channel, it will be understood that the invention could be used in non-symmetric forms such as shown in the aforementioned 20080186722 publication.

To program the device into a programmed state, the device must be shut off by reducing carriers in the channel region, and increasing the threshold voltage. To do this a drain voltage of 6.0V can be applied and this will effectively couple a voltage of about 5.4V to the floating gate. This bias condition will placed the device into a channel hot electron injection regime. The electrons injected into the floating gate effectively increase the threshold voltage of the device. When a subsequent read voltage of 1.0V is applied again on the drain, the device does not conduct current due to its high threshold voltage, and this second state of the device is thus determined. As with the read characteristics, it will be understood to those skilled in the art that the particular coupling ratio, program voltage, etc., will vary from application to application and can be configured based on desired device operating characteristics.

The prior art referred to above is primarily a one time programmable device, since there is no disclosed mechanism for removing the charge on the floating gate. In contrast, some embodiments of the present invention can be made to be capable of multiple-time-programming.

To do this, an erase operation can be introduced to remove or neutralize the electrons that have been injected into the floating gate. The mechanism for removing or neutralizing electrons is preferably through band-band tunneling hot hole injection from the other non-coupling junction 125 of the device. The preferred bias condition would be as followed: the non-coupling junction (source junction) is biased with 6V to cause the junction to initiate band-band tunneling current. The band-band tunneling current causes hot holes to be injected into the floating gate and neutralize the electrons that are stored on the floating gate. Thus it is (re)programmed from a non-conducting, or even a low conducting state, into a conducting state. The device is then able to conduct channel current when a subsequent read voltage is applied to the coupling junction during the read operation. It will be understood that programming from a low conducting state to a conducting state may have a limited operating sense window.

As an additional optional operation, to facilitate erase operation and enhance band-band tunneling current, the coupling junction can be supplied with a negative voltage so that the floating gate is made more negative to cause higher band-band tunneling current across the source junction.

Thus the operating characteristics are preferably as follows:

| OPERATION | Drain | Source | Substrate |
|---|---|---|---|
| Program | 6.0 V | 0V | 0V |
| Read | 1.0 V | 0V | 0V |
| Erase Float or −Vcc | 6.0 V | 0V | |

Figure 5:
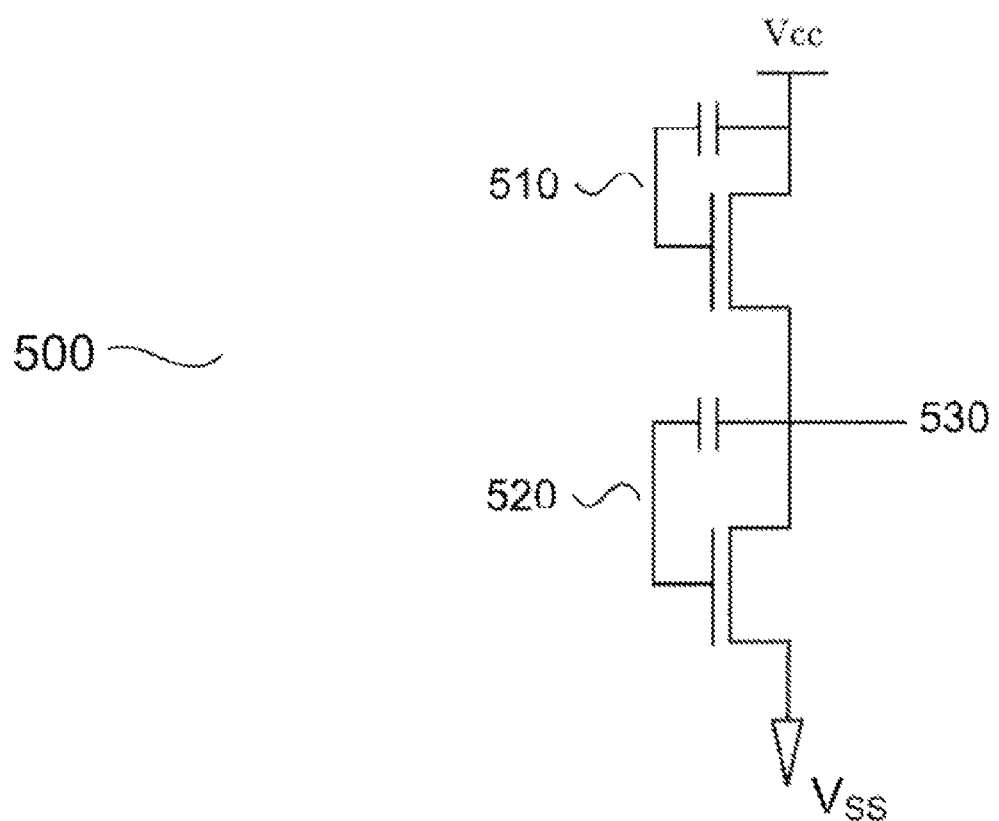
FIG. 5 is an electrical diagram showing a preferred embodiment of a latch circuit and/or configuration circuit constructed with the NV memory cells of the present invention.

In some embodiments, additional protection can be implemented to ensure the OTP and MTP device have sufficient immunity against the loss of charge stored on the floating gate. To do this, the device can be configured into a paired latch 500— as shown in FIG. 5— where the data and its complement are stored into the latch, thus effectively doubling the margin in the stored data. As seen therein, a top device 510 couples a node 530 to a first voltage reference (Vcc) while a second bottom device 520 couples the node to a second voltage reference (Vss). By placing charge on the top device floating gate, the top device 510 is programmed into a non-conductive state, thus ensuring that node 530 is pulled down by bottom device 520 to Vss, representing a first logical data value (0). Similarly, by placing charge on the bottom device floating gate, the bottom device 520 is programmed into a non-conductive state, thus ensuring that node 530 is pulled up by top device 510 to Vcc, representing a second logical data value (1).

Another useful advantage of the present preferred embodiment is that it is implemented with an NMOS device structure, whereas most traditional single-poly OTPs are commonly implemented with a PMOS device structure. This means that the device can be formed at the same time as other n-channel devices on a wafer. Another advantage of an NMOS device structure in this invention is that it behaves similar to an EPROM device, i.e., the device is programmed into a non-conducting state from a conducting state. In contrast, the prior art 20080186722 type device—and other commonly used PMOS OTP devices—are programmed from a non-conducting state into a conducting state.

This aspect of the invention thus can eliminate the need of an additional masking step that is commonly associated with a PMOS OTP device in order to make sure that PMOS device is in a non-conducting state coming out of the manufacturing fab.

In addition, since an NMOS device's programming mechanism with channel hot electrons injection is self-limiting, unlike that case of a PMOS with channel hot electron programming, the amount of energy consumption during programming is self-limited for this invention.

As seen in the present description therefore, the particular configuration of the floating gate is not critical. All that is required is that it be structurally and electrically configured to control channel conduction and also be capacitively coupled to an electrical source of charge carriers. The particular geometry can be varied in accordance with any desired layout or mask. In some instances it may be desirable to implement the floating gate as a multi-level structure for example. Moreover, since capacitive coupling is a function of the materials used, the invention allows for significant flexibility as the composition of the floating gate can also be varied as desired to accommodate and be integrated into a particular process. An array of cells constructed in accordance with the present teachings could include different shapes and sizes of floating gates so that cells having threshold cells could be created.

Configuration Circuit for Programmable Logic

As shown in FIG. 5, two of the OTP/MTP cells can be arranged in a manner such it can serve as a configuration storage circuit 500 in a programmable logic device or FPGA application. To serve as an FPGA configuration bit, an output 530 of the cell/circuit 500 has to be either Vcc (logical high) or Vss (logical low), in order to drive a subsequent CMOS gate (not shown) inside an FPGA's logic block.

As noted above, a single OTP/MTP cell preferably outputs either a fixed amount of read current or very little read current, depending on the programming state of the cell. Thus two of such cells would have to be connected together in an inverter fashion to output either Vcc or Vss.

FIG. 5 illustrates the circuit connection in order to implement an FPGA configuration bit. It is basically two cells with a first device 510 serving as a pull-up transistor and the other one 520 serving as a pull-down transistor in an "inverter" or "voltage divider" configuration. The top and bottom OTP/MTP cells can be programmed or erased by program logic circuit (not shown) into exactly the opposite state of each other, to render output 530 into a particular desired logical value/state—i.e., as either Vcc or Vss.

For passing the Vcc voltage (high logic value) at output node 530, the top OTP/MTP cell 510 is set to be conducting while the bottom OTP/MTP cell 520 is programmed into a non-conducting state. This way, the output node 530 tracks Vcc— minus a threshold voltage which can be set to near zero via a channel implant adjustment as discussed below.

For rendering Vss (low logic value) at the output node 530, the top OTP/MTP cell 510 is programmed into a non-conducting state while the bottom OTP cell 520 is programmed to a conducting state to discharge the output node 530 to Vss or ground. In this fashion, two OTP/MTP devices can be used as a configuration bit in an FPGA logic block, or any other programmable device.

FIG. 6A shows a layout for the configuration circuit 500. A pair of floating gates 610, 610' are coupled to a first drain region 620 and second drain region 620' respectively. The drains 620, 620' are similarly bent around and are preferably joined by an N-type well 630 that typically already exists in a conventional advanced CMOS process. As an alternative, the N-Well 630 can be replaced with an n-type diffusion layer introduced so as to be beneath the poly floating gates. A conventional source region 625 is also utilized.

The floating gate poly 610/610' is extended beyond typical transistor channel regions 635/635' and includes overlap regions 640/640' which overlap active regions extending from the drain junctions. The active region portions 641/641' that are surrounded by the N-Well region serve as an effective capacitive coupling to the pair of floating gates. Thus any voltage applied to the drain junctions will be effectively coupled onto the respective floating gates.

Output 650 drives a configuration value (1 or 0) to a subsequent CMOS gate (not shown). Thus a configuration circuit can be constructed of two OTP/MTP cells.

Because the two devices can be erased and re-programmed, the output 650 of the configuration circuit 600 can be altered as desired to reflect a new configuration value. So a second logical value can be set in the circuit 600 for in-system re-programmability.

Figure 6B:
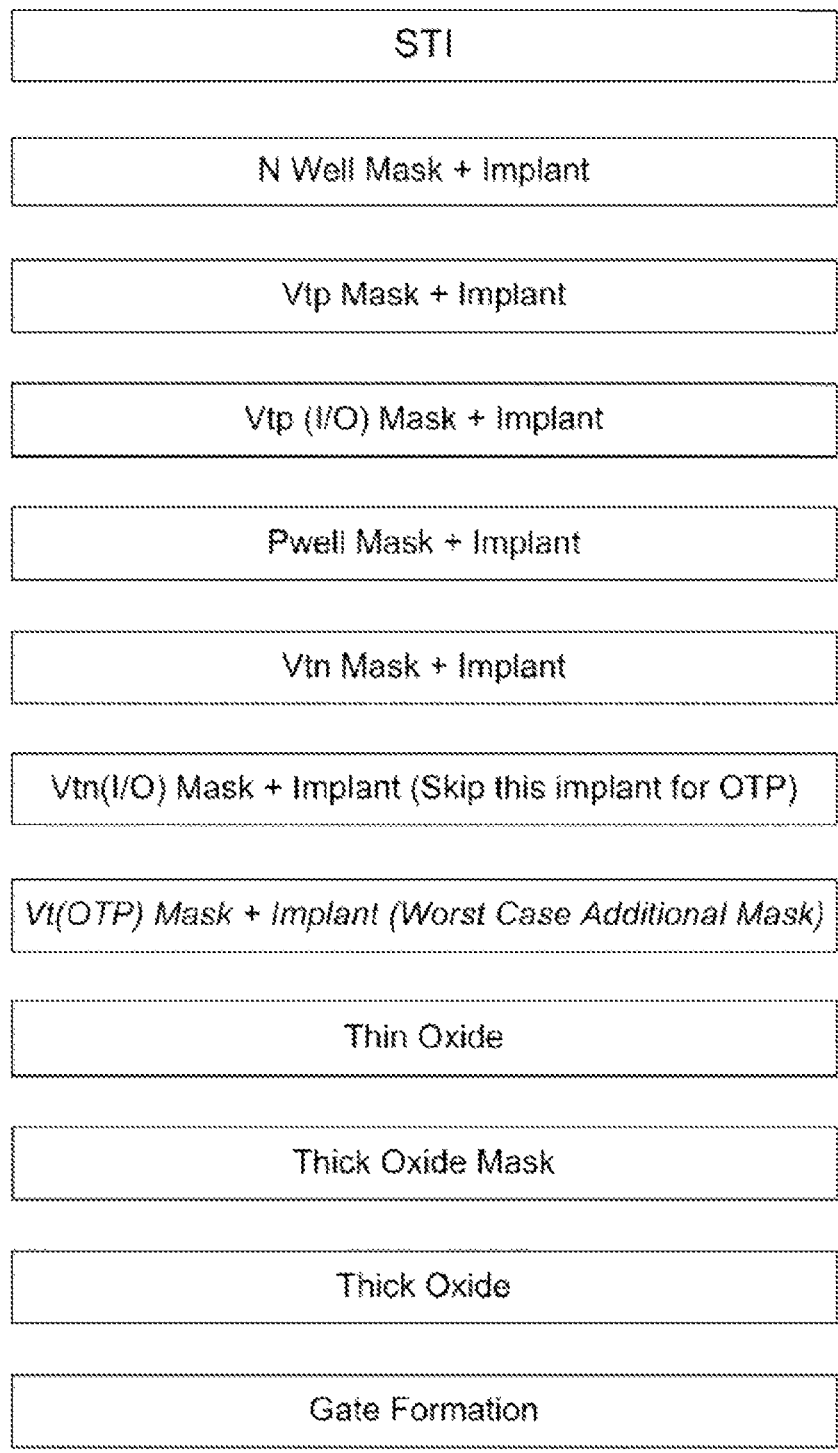
FIG. 6B is a flow diagram showing preferred operations used to manufacture the non-volatile configuration circuit of the present invention.

A flowchart of a fabrication process used to make an integrated logic/NVM configuration circuit is shown in FIG. 6B. As seen therein, the configuration circuit 600 is manufactured using only the nominal processing steps otherwise required to make other logic circuits within a programmable logic device. The only differences are expressly shown to be as follows: a) any OTP/MTP devices are masked and not given an implant for adjusting an I/O device threshold voltage; b) if desired, an optional mask/implant can be introduced to compensate for the threshold voltage loss noted above. In other words, if the configuration circuit output 650 must equal Vcc (i.e, no threshold drop), then this process step can compensate for such drop and afford a full swing output.

The above descriptions are intended as merely illustrative embodiments of the proposed inventions. It is understood that the protection afforded the present invention also comprehends and extends to embodiments different from those above, but which fall within the scope of the present claims.

What is claimed:

1. A programmable non-volatile configuration storage bit circuit on a substrate with a logic circuit, the programmable non-volatile circuit comprising:
    a first floating gate associated with a first non-volatile device;
    a second floating gate associated with a second non-volatile device;
    a first drain region associated with said first non-volatile memory device; and
    a second drain region associated with said second non-volatile memory device;
    wherein the first drain region and the second drain region overlap respective sufficient portions of said first floating gate and said second floating gate to serve as first and second capacitive couplings, respectively, to the first floating gate and the second floating gate, such that a programming voltage applied to said first drain region or said second drain region can be imparted, respectively, to said first floating gate or said second floating gate through the first capacitive coupling or the second capacitive coupling, respectively;
    an output coupled to said first non-volatile device and said second non-volatile device;
    wherein a value of said output of said programmable non-volatile circuit is based on a programmed state of said first non-volatile device and said second non-volatile memory device and can be used to configure a function to be performed by the logic circuit,
    wherein said first non-volatile device is a pull-up device coupled to a first voltage source, and said second non-volatile device is a pull-down device coupled to a second voltage source which has less potential than said first voltage source.

2. The programmable non-volatile circuit of claim 1 wherein the first and second non-volatile devices are n-channel.

3. The programmable non-volatile circuit of claim 1 wherein at least one of said first floating gate and second floating gate is comprised of a material used as a gate for a transistor device situated on the substrate and associated with at least one of a logic gate or a volatile memory.

4. The programmable non-volatile circuit of claim 1 wherein at least one of said first floating gate and second floating gate can be erased.

5. The programmable non-volatile circuit of claim 4 wherein at least one of said first floating gate and second floating gate can be re-programmed.

6. A one-time programmable (OTP) configuration circuit incorporated on a silicon substrate with at least one additional logic circuit or non-OTP configuration circuit, the OTP configuration circuit comprising:
    an OTP n-type channel pull-up memory device coupled to an OTP n-type channel pull-down memory device, each of said OTP n-type channel pull-up memory device and said OTP n-type channel pull-down memory device having a first state and a second state, and each of said OTP n-type channel pull-up memory device and said OTP n-type channel pull-down memory device including a floating gate and a drain region formed solely from structures used as components of other logic devices within a logic circuit.

7. The OTP configuration circuit of claim 6, wherein a common node between said OTP n-type channel pull-up memory device and said OTP n-type channel pull-down memory device provides an output voltage value to a separate CMOS logic gate.

8. The OTP configuration circuit of claim 7, wherein said output voltage value can be varied between a first high reference potential and a second low reference potential.

9. The OTP configuration circuit of claim 7, wherein a channel implant in said OTP n-type channel pull-up memory device is provided to allow said output value to reach a reference potential Vcc used by the OTP configuration circuit.

10. The OTP configuration circuit of claim 6, wherein, when the OTP n-type channel pull-up memory device is in the first state and the OTP n-type channel pull-down memory device is in the second state, the OTP configuration circuit provides an output at a first configuration state, and when the OTP n-type channel pull-up memory device is in the second state and the OTP n-type channel pull-down memory device is in the first state, the OTP configuration circuit provides the output at a second configuration state different than the first configuration state.

11. The OTP configuration circuit of claim 6, wherein, for each OTP memory device of said OTP n-type channel pull-up memory device and said OTP n-type channel pull-down memory device, a threshold voltage of the OTP memory device when the OTP memory device is in the first state is different than a threshold voltage of the OTP memory device when the OTP memory device is in the second state.

12. The OTP configuration circuit of claim 11, wherein the threshold voltage in the second state is greater than the threshold voltage in the first state.

13. A configuration circuit to couple to a logic circuit, the configuration circuit comprising:

a non-volatile pull-up device adapted to cause a first logical value to be presented at an output of the configuration circuit; and a non-volatile pull-down device coupled to said non-volatile pull-up device and adapted to cause a second logical value to be presented at said output;

wherein each of said non-volatile pull-up device and said non-volatile pull-down device has a drain region capacitively coupled to a floating gate, such that a programming charge applied to said drain region can be imparted to said floating gate;

wherein a conductance of said non-volatile pull-up device or said non-volatile pull-down device can be permanently set to a first state or a second state different from the first state to control said output provided to the logic circuit.

14. The configuration circuit of claim 13, wherein a channel implant in said non-volatile pull-up device is provided to allow said output to reach a full reference potential Vcc used by the configuration circuit.

15. The configuration circuit of claim 13, wherein a conductance of said non-volatile pull-up device or said non-volatile pull-down device can be programmed to the first state or the second state to control said output provided to the logic circuit, said conductance retaining said programmed state unless subsequently reprogrammed.

* * * * *